(12) United States Patent
Egitto et al.

(10) Patent No.: US 8,240,027 B2
(45) Date of Patent: Aug. 14, 2012

(54) METHOD OF MAKING CIRCUITIZED SUBSTRATES HAVING FILM RESISTORS AS PART THEREOF

(75) Inventors: Frank D. Egitto, Binghamton, NY (US);
John S. Kresge, Binghamton, NY (US);
John M. Lauffer, Waverly, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 963 days.

(21) Appl. No.: 12/007,820

(22) Filed: Jan. 16, 2008

(65) Prior Publication Data
US 2009/0178271 A1    Jul. 16, 2009

(51) Int. Cl.
*H01C 17/06*    (2006.01)
*H01C 17/24*    (2006.01)
*H01C 17/242*    (2006.01)

(52) U.S. Cl. ............... 29/620; 29/621; 338/195

(58) Field of Classification Search .......... 29/610.1, 29/620, 621; 338/195
See application file for complete search history.

(56) References Cited

U.S. PATENT DOCUMENTS

| | | |
|---|---|---|
| 3,284,878 A | 11/1966 | Best |
| 3,441,804 A | 4/1969 | Klemmer |
| 3,573,703 A | 4/1971 | Burks et al. |
| 3,594,679 A | 7/1971 | Seay et al. |
| 3,947,801 A | 3/1976 | Bube |
| 4,163,315 A | 8/1979 | Neese |
| 4,338,590 A | 7/1982 | Connolly, Jr. et al. |
| 4,906,966 A | 3/1990 | Imamura et al. |
| 5,039,570 A * | 8/1991 | Sturm .................. 428/209 |
| 5,295,387 A | 3/1994 | Buie et al. |
| 5,757,264 A | 5/1998 | Petit |
| 5,808,272 A | 9/1998 | Sun et al. |
| 5,994,997 A | 11/1999 | Brown et al. |
| 6,021,050 A | 2/2000 | Ehman et al. |
| 6,047,463 A | 4/2000 | Ulmer |
| 6,396,387 B1 | 5/2002 | Hunt et al. |
| 6,452,478 B1 | 9/2002 | Dale |
| 6,500,350 B1 | 12/2002 | Hunt et al. |
| 6,534,743 B2 | 3/2003 | Swenson et al. |
| 6,539,613 B1 | 4/2003 | Ulmer |

(Continued)

FOREIGN PATENT DOCUMENTS

JP    06338406 A  *  12/1994

OTHER PUBLICATIONS

Machine Translation of JP06338406A, obtained Feb. 26, 2011.*

*Primary Examiner* — Livius R Cazan
(74) *Attorney, Agent, or Firm* — Mark Levy; Lawrence R. Fraley; Hinman, Howard & Kattell (57) ABSTRACT

A method of making a circuitized substrate which involves forming a plurality of individual film resistors having approximate resistance values as part of at least one circuit of the substrate, measuring the resistance of a representative (sample) resistor to define its resistance, utilizing these measurements to determine the corresponding precise width of other, remaining film resistors located in a defined proximity relative to the representative resistor such that these remaining film resistors will include a defined resistance value, and then selectively isolating defined portions of the resistive material of these remaining film resistors while simultaneously defining the precise width of the resistive material in order that these film resistors will possess the defined resistance.

16 Claims, 3 Drawing Sheets

U.S. PATENT DOCUMENTS

| | | |
|---|---|---|
| 6,740,701 B2 | 5/2004 | Chacko |
| 6,746,508 B1 | 6/2004 | Deevi et al. |
| 6,940,038 B2 | 9/2005 | Biunno et al. |
| 7,235,745 B2 | 6/2007 | Das et al. |
| 2003/0146418 A1 | 8/2003 | Chacko |
| 2005/0000728 A1 | 1/2005 | Tanaka |
| 2005/0051360 A1 | 3/2005 | Su et al. |
| 2006/0205121 A1 | 9/2006 | Couch et al. |

\* cited by examiner

METHOD OF MAKING CIRCUITIZED SUBSTRATES HAVING FILM RESISTORS AS PART THEREOF

TECHNICAL FIELD

The present invention relates to providing resistors for circuitized substrates such as printed circuit boards, chip carriers and the like, and more specifically to a method for doing so and to products including such resistors as part thereof. Even more particularly, the invention relates to such methods and products wherein the resistors are film resistors formed using trimming processes. Such resistors are also referred to in the art as trimmable resistors.

CROSS REFERENCE TO CO-PENDING APPLICATIONS

In Ser. No. 11/806,685, filed Jun. 4, 2007 and entitled "Circuitized Substrate With Internal Resistor, Method Of Making Said Circuitized Substrate, And Electrical Assembly Utilizing Said Circuitized Substrate," there is defined a circuitized substrate which utilizes at least one internal (embedded) resistor as part thereof, the resistor comprised of a material including resin and a quantity of powders of nano-particle and/or micro-particle sizes. The resistor serves to decrease the capacitance in the formed circuit while only slightly increasing the high frequency resistance, thereby improving circuit performance through the substantial elimination of some discontinuities known to exist in structures like these. An electrical assembly (substrate and at least one electrical component) is also provided. This application is assigned to the same Assignee as the present invention.

BACKGROUND OF THE INVENTION

Printed circuit boards (hereinafter also referred to as PCBs), chip carriers, and the like (these products referred to generally herein as circuitized substrates) are typically constructed in laminate form in which several layers of dielectric material and conductive material bonded together using relatively high temperature and pressure lamination processes. The conductive layers, typically of thin copper or copper alloy, function as the circuit layers for the resulting multilayered substrate, and, if a signal layer, typically include a pattern of lines, pads, etc. (The conductive layer may also be of substantially solid construction and serve, e.g., as a power or ground layer). If a signal layer, the formed circuits may also include passive devices such as capacitors, resistors, inductors, and the like. These circuits are usually used in the formed final product for providing electrical connections to and among various devices located on the surface of the substrate, examples of such devices being integrated circuits (semiconductor chips) and modules such as chip carriers having one or more chips as part thereof. As is known, many such circuits, both internal and external, utilize what are known as film resistors as part thereof.

Film resistors, as further evidenced by the patents and pending applications listed below, are often utilized as part of substrate circuits. Film resistors are commonly used in hybrid circuits and include thick film resistors which are conventionally formed by screen-printing a resistive material on an insulating substrate and then firing the material, and thin film resistors which are conventionally formed by sputtering or vacuum-depositing a resistive material on an insulating substrate. In a different approach, it is known to provide resistors in a sheet form in which a thin, defined layer of resistive material is deposited on a thin conductor layer, typically copper, and this bi-layered member is then bonded to the substrate with the resistive material face down or directly on the substrate's upper surface. Subsequent processing is used to define from this large bi-layered member a defined series of individual resistors each including a pair of spaced apart, opposed conductors ("lands") on the resulting resistive material configuration, with electrical current then designed to run from one conductor to another, through the resistive material of course. The conductors in turn are electrically coupled to remaining circuitry, e.g., signal lines, which form the desired circuit pattern on the substrate's surface.

In many circuits, it is often necessary to adjust the resistance of the film resistors in the circuit. To increase the resistance of a film resistor, the resistor is "trimmed", often by forming a slot across the electrical current path in the resistor to make the effective width of the resistor (and the current path there-through) smaller and thereby increasing resistance (see more below). This channel may be formed by mechanical abrasion, chemical etching, or laser vaporization (ablation) of the resistor material, as discussed in greater detail below. At present, film resistors typically require resistive material of different ranges and values. The final resistance value depends on the aspect ratio of the resistor and the sheet resistivity of the resistive material. When a wide range of values is required in the manufacture of a hybrid circuit, the deposition of resistor material must be repeated for each different range of resistance values. Such resistors are processed to lower values than the circuit calls for and after completion of the manufacturing process are "trimmed up" in value to the resistance required in the circuit. This method has been found to be costly and time consuming in manufacturing hybrid film circuits because of the need for two or more different resistor compositions. Such resistors are thus relatively expensive to produce and to position on the surface of a substrate layer (e.g., dielectric) to be connected to the selected parts of the circuit. That is, precisely forming such resistors on selected locations of high density circuits with exacting resistor values is considered difficult when forming such high density circuit patterns as are so often required in many of today's micro-miniature circuit products.

As mentioned in the preceding paragraph, the use of lasers for "trimming" resistors is known. Generally speaking, laser trimming is used in two ways to produce a change (higher ohms) in thick (polymer) resistors: (a) by reducing or changing the path of current through the resistor in terms of magnitude and direction; and (b) by reducing or changing the cross-sectional area perpendicular to the direction of current flow. The first method, mentioned above, is typically performed by making a trim slice through a portion of the resistor to create a localized reduction in the cross-sectional area relative to the direction of current flow. This method, however, may distort the electrical field around the slice cut and produce undesirable variations in the impedance of the resistor at higher signal frequencies. The second approach performs a planar cut to reduce the cross-sectional area of the resistor in the direction of current flow. Because only the magnitude of the current is affected and not the direction, high frequency impedance will not typically be affected in a significant manner.

The present invention defines the formation of highly precise, film resistor values for individual film resistors which form part of a circuit pattern on a layer for use in a circuitized substrate. As defined, the resulting resistors may form part of internal circuits (e.g., when the layer is bonded to other dielectric and conductive layers to form a larger, thicker final product) and are also applicable to the formation of such resistors on the exterior circuits of such products. The invention is applicable to both thick and thin film resistors.

With particular respect to internal resistors, formation thereof is especially desired for many of today's substrate designs. Known discrete passive devices, such as capacitors, resistors, inductors, and the like, typically occupy a relatively high percentage of the exterior surface area of the completed multilayered substrate product, which is undesirable from a future design aspect because of the aforementioned need for increased miniaturization. In order to increase the available exterior substrate surface area (also often referred to as "real estate"), there have been a variety of efforts to use internal circuits with such devices as part thereof. A capacitor or resistor designed for disposition within (e.g., between selected layers) a substrate may thus be referred to as an embedded integral passive component, or, more simply, an embedded resistor or capacitor. Such a capacitor thus provides internal capacitance while a resistor provides internal resistance. The result of this internal positioning is that it is unnecessary to also position such devices externally on the PCB's outer surface(s), thus saving valuable PCB surface area. Examples of these are also shown in the patents listed below. As understood from the teachings herein, the layered structures including circuits having the resistors formed in accordance with the instant teachings may be incorporated within larger substrate structures, e.g., as part of a lamination process with other layers.

With respect to resistor materials for thick and/or thin resistors of the type defined herein, commercially available dielectric powders are known, in addition to a wide range of other commercially available products (mentioned below). These are known to be produced by a high-temperature, solid-state reaction of a mixture of the appropriate stoichiometric amounts of oxides or oxide precursors (e.g., carbonates, hydroxides or nitrates) of barium, calcium, titanium, and the like. In such calcination processes, the reactants are wet-milled to accomplish a desired final mixture. The resulting slurry is dried and fired at elevated temperatures, sometimes as high as 1,300 degrees Celsius (C), to attain the desired solid state reactions. Thereafter, the fired product is milled to produce a powder. Although the pre-fired and ground dielectric formulations produced by solid phase reactions are acceptable for many electrical applications, these suffer from several disadvantages. First, the milling step may serve as a source of contaminants, which can adversely affect electrical properties. Second, the milled product may consist of irregularly shaped fractured aggregates which are often too large in size and possess a wide particle size distribution, 500-20,000 nm. Consequently, films produced using these powders are limited to thicknesses greater than the size of the largest particle. Thirdly, powder suspensions or composites produced using pre-fired ground ceramic powders must be used immediately after dispersion, due to the high sedimentation rates associated with large particles. The stable crystalline phase of barium titanate for particles greater than 200 nm is tetragonal and, at elevated temperatures, a large increase in dielectric constant occurs due to a phase transition. It is thus clear that methods of making PCBs which rely on the advantageous features of using nano-powders as part of the circuitized substrate's internal components or the like may possess various undesirable aspects which are detrimental to providing a circuitized substrate with optimal functioning capabilities when it comes to internal resistance, capacitance or other electrical properties.

The above is particularly true when the desired final product includes thru-holes as part thereof, these thru-holes passing through selected layers in the product and interconnecting selected conductors such as lines or pads from one layer to another, sometimes interconnecting several layers. The thru-holes consume further space, especially when used in high density patterns such as up to 5,000 thru-holes per square inch of substrate surface area. As is known, extremely close positioning of such thru-holes and signal lines and/or pads may result in discontinuities occurring therein, which will adversely affect the successful operation of the product, especially at high frequencies (which are also demanded in many products today). These structures may result in signal degradation, particularly, as stated, when the signal lines and/or thru-holes are positioned in close proximity to one another. The successful elimination of such discontinuities is thus highly desired for many of today's circuitized substrates, especially those intended to pass high speed signals using high density patterns of thru-holes and/or signal lines. As defined, the method taught herein is able to form such precise resistor structures in such as way as not to adversely affect the resulting operation of closely positioned conductive thru-holes, other signal lines, etc.

It is known that in some resistor trimming operations, simultaneous electrical probing and laser trimming operations are used. Probing individual resistors on a work piece is time consuming and requires utilization of expensive capital equipment (a laser with an incorporated electrical test system). This approach also becomes impractical from a cost standpoint when the number of individual resistors is large. These systems typically further require a probe card to "cover" a specified area on the substrate (within a set distance from one resistor), but this in turn limits the number of resistors within said area to a relatively few (e.g., fifty or less). With circuitized substrates such as printed circuit boards and chip carriers requiring more and more discrete structures such as resistors, capacitors and the like as part thereof, the simultaneous probe and trim approach is now considered too costly.

As will be further understood from the following, the present invention defines a new method of providing such precise resistor values for film resistors used as part of electrical circuits on both internal and external surfaces of substrate products. Significantly, the invention is able to do so in a manner which overcomes many of the disadvantages associated with processes such as described above as well as within selected ones of the following listed documents. The citation of these documents is not an admission that any are prior art to the present invention, nor that the documents are the result of an exhaustive search of the art.

In U.S. Pat. No. 3,284,878, entitled, "Method of Forming Thin Film Resistors", there is described a method of forming electrical resistors and more particularly to a method of adjusting the resistance of thin films by selectively removing portions thereof.

In U.S. Pat. No. 3,441,804, entitled, "Thin-Film Resistors", there is described thin-film resistors that include a basic resistor inter-coupled with a network of selectively inter-coupled individual trimming resistors which add or subtract selected increments of resistance to that of the basic resistor. The smallest value trimming resistor provides a predetermined impedance $Z_1$, while each other trimming resistor provides an impedance equal to a different power of two times $Z_1$. A severable electrical conductor is associated with each trimming resistor to selectively effectively electrically connect or not connect the associated resistor into the network. The trimming resistors may be connected in series, with each severable conductor in parallel with a different trimming resistor; or the trimming resistors may be connected in parallel, with each severable conductor in series with a different trimming resistor.

In U.S. Pat. No. 3,573,703, entitled, "Resistor And Method of Adjusting Resistance", there is described a resistor formed on an insulating support between a pair of electrode terminals, a portion of the resistor extending out of the direct field established between the electrodes. The resistance value is precisely adjusted by removing resistor material in the fringing field.

In U.S. Pat. No. 3,594,679, entitled, "Method of Making Low Noise Film Resistors And Article", there is described a method of forming a low current noise, thin film resistor having a thin electro-conductive or resistive film applied to a dielectric substrate with a portion of the film thereafter being removed so as to increase the length to width ratio thereof. The method includes the step of rubbing, smoothing, or polishing the edges of the remaining film surrounding the area where said portion was removed with a rubber-like member whereby resistor current noise is significantly decreased.

In U.S. Pat. No. 3,947,801, entitled, "Laser-Trimmed Resistor", there is described a laser-trimmed film resistor wherein the laser kerf terminates in an area outside the electrical current path across the resistor.

In U.S. Pat. No. 4,163,315, entitled, "Method for Forming Universal Film Resistors", there is described a method for forming a film resistor for hybrid circuits trimmable from 0 ohms to infinite resistance, whereby resistive material is deposited over previously applied conductive material. One edge of the resistor material is flush with one edge of the conductor path and the resistor material extends beyond the opposite side of the conductor path. The resistor is trimmed to value by a laser or mechanically abrading a slot in its center perpendicular to the conductor by simultaneously removing a portion of both conductor and resistive material.

In U.S. Pat. No. 4,338,590, entitled, "Multi Stage Resistive Ladder Network Having Extra Stages For Trimming", there is described a multi-stage resistive ladder network which uses extra stages to trim out resistance discrepancies. All of the stages are interconnected in a series. Nominally, current is divided in half within each stage. Half of the current is gated onto a bus in response to logic control signals, and the other half of the current is passed onto the next succeeding stage. Due to various processing limitations, the resistors comprising each stage vary slightly from their nominal value, which in turn upsets the current division. To compensate for this additional current dividing stages are serially connected to the last stage of the ladder. Current from these additional stages are selectively coupled onto the bus in response to the logic signals in addition to the current which is normally coupled thereto.

In U.S. Pat. No. 4,906,966, entitled, "Trimming Resistor Network", there is described a trimming resistor network including first and second external connection terminals, a first resistor having two ends acting as first and second connection terminals, a first coupling body for connecting the first external connection terminal to the first connection terminal via series-connected resistors, a second coupling body for connecting the second external connection terminal to the second connection terminal directly or via series-connected resistors, and parallel trimming resistors having two ends respectively connected to the first and second coupling bodies. The combined resistance between the first and second external connection terminals is increased by substantially a preset amount each time one of the parallel trimming resistors is cut off.

In U.S. Pat. No. 5,295,387, entitled, "Active Resistor Trimming of Accelerometer Circuit", there is described a micromachined accelerometer unit and a hybrid accelerometer circuit for processing a signal from the unit mounted in the same package with the substrate of the hybrid circuit in a plane normal to the sensitivity axis of the accelerometer. For calibration, thick film resistors on the substrate are laser trimmed at two different temperatures in two stations. The package is mounted on a shaker table with the substrate normal to the direction of vibration and a trimming laser beam normal to the substrate is directed onto the substrate to trim the resistors while the package is being vibrated. The AC (alternating current) signal produced by the circuit is monitored by test equipment and compared to a reference value to determine any signal error and to control the laser beam. The laser beam has a finite range where the depth of focus is suitable for resistor trimming and the amplitude of vibration is much smaller than that range to permit trimming during the mechanical excitation. Alternatively, the amplitude of vibration is larger than the depth of focus and the operation of the laser is synchronized with the motion of the substrate to turn on the laser only when the resistor being trimmed is within the range of the depth of focus.

In U.S. Pat. No. 5,757,264, entitled, "Electrically Adjustable Resistor Structure", there is described a resistor structure which resistance value is electrically adjusted after fabrication by a tester during the test operation so that its equivalent resistance closely approximates a desired nominal value. The resistor structure includes a main resistor and a number of trimming resistors connected in parallel. Each trimming resistor can be connected in parallel to the main resistor independently of one another via a switch, typically a passgate NFET device, and serially connected therewith. The switch is enabled via a control line coupled to a binary storage cell. It includes a programmable fuse that can be electrically blown by the tester. Because the resistance value of the main resistor and trimming resistors changes as a result of fabrication process variations, the trimming resistors are designed so that no matter what the equivalent resistance value of the main resistor is, there exist an appropriate combination of trimming resistors to achieve the desired nominal value. This resistor structure is well suited for IC terminator chips.

In U.S. Pat. No. 5,808,272, entitled, "Laser System For Functional Trimming Of Films and Devices", there is described a laser system and processing method which exploits a wavelength range in which devices, including any semiconductor material-based devices affected by conventional laser wavelengths and devices having light-sensitive or photo-electronic portions integrated into their circuits, can be effectively functionally trimmed without inducing performance drift or malfunctions in the processed devices. True measurement values of operational parameters of the devices can, therefore, be obtained without delay for device recovery, i.e., can be obtained substantially instantaneously with laser impingement. Accordingly, the present invention allows faster functional laser processing, eases geometric restrictions on circuit design, and facilitates production of denser and smaller devices.

In U.S. Pat. No. 5,994,997, entitled, "Thick Film Resistor Having Concentric Terminals And Method Therefor", there is described a thick-film resistor and a process for forming the resistor to have accurate dimensions, thereby yielding a precise resistance value. The resistor generally includes an electrically resistive layer and a pair of terminals, a first of which is surrounded by the second terminal, so as to form a region there-between that surrounds the first terminal and separates the first and second terminals. The terminals are preferably concentric, with the second terminal and the region therebetween being annular-shaped. The resistive layer electrically connects the first and second terminals to complete the resistor. Each of the terminals has a surface that is substantially parallel to an upper and/or lower surface of the resistive layer and contacts the resistive layer. The surfaces of the terminals may be embedded in the resistive layer by printing the resistive material over the terminals, or may contact the upper or lower surface of the resistive layer by locating the terminals above or below the resistive layer. In each of these embodiments, the terminals are not limited to having edge-to-edge contact with the resistive layer, such that the interfacial resistance there-between is minimized.

In U.S. Pat. No. 6,021,050, entitled "Printed Circuit Boards With Integrated Passive Components And Method Of Making Same," there is described a multi-layered printed circuit board having a plurality of buried passive elements and a method for producing the circuit board wherein the passive elements can include resistors, capacitors and inductors. The method includes the steps of manufacturing individual layers of the multi-layer printed circuit board with electrical circuits thereon and subsequently screening polymer inks having resistive, dielectric or magnetic values to form the resistors, capacitors and inductors. Each layer of the circuit board is cured to dry the polymer ink and thereafter the individual layers are bonded together to form the multi-layer board.

In U.S. Pat. No. 6,047,463, entitled, "Embedded Trimmable Resistors", there is defined a resistor which may be embedded into a substrate. A portion of the resistor may be exposed, by segmenting the substrate, for instance, so that the resistor may be trimmed to a desired resistance level. Alternatively, a portion of a resistor may be embedded into a substrate, with another portion of the resistor being disposed on the outer surface of the substrate. The portion of the resistor on the outer surface may be trimmed to adjust the resistance of the resistor to a desired level.

In U.S. Pat. No. 6,396,387, entitled "Resistors For Electronic Packaging" and issued May 28, 2002, there are described thin layer resistors which are formed on an insulating substrate, which resistors may be embedded within a printed circuit board. Preferred resistive materials are homogeneous mixtures of metals, such as platinum, and dielectric materials, such as silica or alumina. Even minor amounts of dielectric material admixed with a metal significantly increase the resistance of the metal. Preferably, the resistive material is deposited on the insulating substrate by combustion chemical vapor deposition (CCVD). In the case of zero valence metals and dielectric material, the homogeneous mixture is achieved by co-deposition of the metal and dielectric material by CCVD. To form discrete patches of the resistive material, substantially any metal-based resistor material, including those based on the noble metals, can be etched away. Thus, a layer of resistive material may be covered with a patterned resist, e.g., an exposed and developed photo-resist, and exposed portions of the underlying layer of resistive material etched away. This patent also describes the formation of thin layer resistors including the insulating substrate, discrete patches of a layer of resistive material, and conductive material in electrical contact with spaced-apart locations on the patches of resistive material layer, such conductive material providing for electrical connection of the resistive material patches with electronic circuitry. Such structures of insulating material, resistive material, and conductive material may be formed by selective etching procedures.

In U.S. Pat. No. 6,452,478, entitled, "Voltage Trimmable Resistor", there is described an adjustable resistor between a first terminal and a second terminal. Generally, a plurality of resistors is provided comprising a set of trimmable resistors, where the trimmable resistors are electrically connected together in series, and a set of static resistors, where each static resistor is connected in parallel with a trimmable resistor of the set of trimmable resistors. A trim terminal and a plurality of diodes where each diode is electrically connected between a trimmable resistor and a trim terminal are also provided.

In U.S. Pat. No. 6,500,350, entitled "Formation of Thin Film Resistors" and issued Dec. 31, 2002, there is described a method for forming a patterned layer of resistive material in electrical contact with a layer of electrically conducting material. A three-layer structure is formed which comprises a metal conductive layer, an intermediate layer formed of material which is degradable by a chemical etchant, and a layer of resistive material of sufficient porosity such that the chemical etchant for the intermediate layer may seep through the resistive material and chemically degrade the intermediate layer so that the resistive material may be ablated from the conductive layer wherever the intermediate layer is chemically degraded. A patterned photo-resist layer is formed on the resistive material layer. The resistive material layer is exposed to the chemical etchant for the intermediate layer so that the etchant seeps through the porous resistive material layer and degrades the intermediate layer. Then, portions of the resistive material layer are ablated away wherever the intermediate layer has been degraded.

In U.S. Pat. No. 6,534,743, entitled, "Resistor Trimming With Small Uniform Spot From Solid-State UV Laser", there is described a uniform laser spot, such as from an imaged shaped Gaussian output (118) or a clipped Gaussian spot, that is less than twenty microns in diameter which can be employed for both thin and thick film resistor trimming to substantially reduce micro-cracking. These spots can be generated in an ablative, non-thermal, UV laser wavelength to reduce the HAZ and/or shift in TCR.

In U.S. Pat. No. 6,539,613, entitled, "Method of Forming Trimmable Resistors", there is described a method of forming trimmable resistors, resistor may be embedded into a substrate. A portion of the resistor may be exposed, by segmenting the substrate, so that the resistor may be trimmed to a desired resistance level. Alternatively, a portion of a resistor may be embedded into a substrate, with another portion of the resistor being disposed on the outer surface of the substrate. The portion of the resistor on the outer surface may be trimmed to adjust the resistance of the resistor to a desired level.

In U.S. Pat. No. 6,740,701, entitled "Resistive Film", there is described a resistive film for use in a potentiometer. The film is in contact with a movable wiper. The film includes a cured polymer resin and a cured thermosetting resin. Conductive particles of carbon black and graphite are dispersed in the film. The conductive particles cause the resins to be electrically resistive. Carbon nano-particles are also dispersed in the film. The nano-particles increase the wear resistance of the resistive film and reduce electrical noise as the wiper moves across the film. In the preparation of an exemplary composition, a polymer solution is made by mixing 10-20 wt. percent of a polymer and 0-10 wt. percent thermosetting resin in 60-80 wt. percent N-methyl pyrrolidone, based upon the total composition. The polymer is mixed with both the conductive and nano-particles to form a paste with a fine particle size. At this point, surfactants and rheological additives may be added if desired to modify the properties of the resistive composition. The particle size range and viscosity of the paste is monitored to get a resistive paste suitable for application in position sensors. The milling time and milling quantity on the ball mill determines the final particle distribution, size and resulting rheology.

In U.S. Pat. No. 6,746,508, entitled, "Nanosized Intermetallic Powders," there is described the use of nanoparticles of intermetallic alloys such as FeAl, Fe3Al, NiAl, TiAl and FeCoV which exhibit a wide variety of interesting structural, magnetic, catalytic, resistive and electronic, and bar coding applications. The nanosized powders can be used to make structural parts having enhanced mechanical properties, magnetic parts having enhanced magnetic saturation, catalyst materials having enhanced catalytic activity, thick film circuit elements having enhanced resolution, and screen printed images such as magnetic bar codes having enhanced magnetic properties. In contrast to bulk FeAl materials which are nonmagnetic at room temperature, the FeAl nanoparticles exhibit magnetic properties at room temperature.

In U.S. Pat. No. 6,940,038, entitled "Laser Trimming of Resistors", there is described a method for laser trimming resistors printed on a substrate layer. In one embodiment, a resistance value is measured for each annular resistor and sorts the annular resistors into one or more bins based on the measured resistance values and target resistance values associated with each resistor. A laser trim file may then be assigned to each bin based on a predictive trim formulation, where each laser trim file defines a set of configuration parameters for a laser drill to conform each resistor to the respective target value. The laser drill uses the laser trim files to trim the resistors within each bin in accordance with the laser trim file assigned to that bin.

In U.S. Pat. No. 7,235,745, entitled, "Resistor Material With Metal Component For Use In Circuitized Substrates, Circuitized Substrate Utilizing Same, Method of Making Said Circuitized Substrate, and Information Handling Utilizing Said Circuitized Substrate", there is described a material for use as part of an internal resistor within a circuitized substrate which includes a polymer resin and a quantity of nano-powders including a mixture of at least one metal component and at least one ceramic component. The ceramic component may be a ferroelectric ceramic and/or a high surface area ceramic and/or a transparent oxide and/or a dope manganite. Alternatively, the material will include the polymer resin and nano-powders, with the nano-powders comprising at least one metal coated ceramic and/or at least one oxide coated metal component. A circuitized substrate adapted for using such a material and resistor therein and a method of making such a substrate are also provided. An electrical assembly (substrate and at least one electrical component) and an information handling system (e.g., personal computer) are also provided. U.S. Pat. No. 7,235,745 is assigned to the same Assignee as the present invention.

In U.S. Patent Application Publication 2003/0146418 A1, entitled "Resistive Film," there is described a resistive film for use in a potentiometer. The film is in contact with a movable wiper. The film includes a cured polymer resin and a cured thermosetting resin. Conductive particles of carbon black and graphite are dispersed in the film. The conductive particles cause the resins to be electrically resistive. Carbon nano-particles are also dispersed in the film. The nano-particles increase the wear resistance of the resistive film and reduce electrical noise as the wiper moves across the film.

In U.S. Patent Application Publication 2005/0000728 A1, entitled "Wiring Board Provided With A Resistor And Process For Manufacturing The Same," there is described a wiring board provided with a resistor, The board comprises an insulating substrate having a surface, wiring patterns formed on the surface, the wiring patterns including first and second electrodes spaced from each other by a certain distance, a first resistor (horizontal type resistor) formed on the surface, the first resistor having respective ends connected with the first and second electrodes, respectively, the wiring patterns further including a third electrode, occupying a first plane area on the surface, a second resistor (vertical type resistor) formed on the third electrode, a fourth electrode formed on the second resistor, and the second resistor, the fourth electrode being located in a second plane area within the first plane area.

In U.S. Patent Application Publication 2005/0051360 A1, entitled "Polymer Thick-Film Resistive Paste, A Polymer Thick-Film Resistor And A Method And An Apparatus For The Manufacture Thereof," there are described formulations, apparatus and a method of applying high thixotropic index polymer thick-film resistive pastes for making polymer thick-film resistors with improved tolerances by providing a squeegee with a blade tilted at an angle of 10 to 85 to the surface of the printed circuit board. The tilted blade causes a fluid rotational motion within the bead of the polymer thick-film resistive paste as the squeegee blade moves relative to the printed circuit board. This rotational motion increases the shear strain rate experienced by the paste within the bead and results in a more effective filling of the resistor-shaped cavity without including air bubbles, experiencing elastic recovery of the paste and, without surface fractures of the paste.

In U.S. Patent Application Publication 2006/0205121 A1, entitled, "Method and System For High-Speed, Precise Micromachining An Array Of Devices", there is described a method and system for high-speed, precise micromachining an array of devices wherein improved process throughput and accuracy, such as resistor trimming accuracy, are provided. The number of resistance measurements is limited by using non-measurement cuts, using non-sequential collinear cutting, using spot fan-out parallel cutting, and using a retrograde scanning technique for faster collinear cuts. Non-sequential cutting is also used to manage thermal effects and calibrated cuts are used for improved accuracy. Test voltage is controlled to avoid resistor damage.

The teachings of the above patents, publications and cited co-pending applications are incorporated herein by reference.

It is believed that a method as taught herein will represent a significant advancement in the art. As understood from the following description, this method obviates many of the disadvantages associated with methods known in the art such as many of those discussed in the foregoing documents.

OBJECTS AND SUMMARY OF THE INVENTION

It is, therefore, a primary object of the present invention to enhance the circuitized substrate art.

It is another object of the invention to provide a method of making extremely small resistors as part of highly dense circuit patterns for use in such circuitized substrates, including both internally and externally.

It is still another object to provide such a method which may be accomplished in a relatively facile manner and at relatively low costs in comparison to many known processes.

According to one aspect of the invention, there is provided a method of making a circuitized substrate having circuitry including a plurality of film resistors as part thereof, the method comprising providing a conductive layer having a layer of resistor material thereon, providing a dielectric layer, bonding this conductive layer to the dielectric layer such that the layer of resistor material directly contacts the dielectric layer, removing selected portions of the conductive layer and resistor material to form a plurality of individual members each including a length and width of resistor material and a portion of conductive layer, removing selected portions of the portion of the conductive layer on each of these individual members to define first and second spaced apart conductors on the length and width of resistor material of each of the individual members and thereby define a plurality of individual film resistors, determining a representative resistance value of a representative film resistor of these plurality of individual film resistors according to length and width dimensions of the resistor material of the representative film resistor, utilizing this representative resistance value to determine the precise width of resistor material of selected ones of the remaining individual film resistors so as to provide a desired resistance value for each of these selected ones of remaining individual film resistors, and etching a pattern of lines within the resistor material of each of the remaining individual film resistors to define the precise width of resistor material for each remaining individual film resistor in order that selected ones of these remaining individual film resistors will each possess the desired resistance.

BEST MODE FOR CARRYING OUT THE INVENTION

For a better understanding of the present invention, together with other and further objects, advantages and capabilities thereof, reference is made to the following disclosure and appended claims in connection with the above-described drawings. Like figure numbers are used from Figure to Figure to identify like elements in these drawings.

By the term "circuitized substrate" as used herein is meant to include substrates having at least one (and preferably more) dielectric layer(s) and at least one (and preferably more) metallurgical conductive layer(s) which serve as circuit layers for the final substrate product. Such a product may include several dielectric and conductive layers, typically oriented in an alternating manner. Examples of dielectric materials include fiberglass-reinforced epoxy resins (some referred to as "FR-4" dielectric materials in the art), polytetrafluoroethylene (Teflon), polyimides, polyamides, cyanate resins, photo-imageable materials, and other like materials. Acceptable metals for the conductive layers (e.g., power, signal and/or ground) include copper and copper alloys, but may include additional metals (e.g., nickel, aluminum, etc.) or alloys thereof. Examples of such circuitized substrates, as mentioned above, include printed circuit boards (or cards) and chip carriers. It is believed that the teachings of the instant invention are also applicable to what are known as "flex" circuits (which use dielectric materials such as polyimide) and those which use ceramic or other non-polymer type dielectric layers, one example of the latter being what are referred to as multi-layered ceramic (MLC) modules adapted for having one or more semiconductor chips mounted thereon.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface and/or to internal circuitry using one or more thru-holes. Perhaps the most well known such assembly is the conventional printed circuit board (PCB) typically having several such external electrical components thereon (including possibly one or more chip carriers) and coupled to the internal circuitry of the PCB and/or each other.

By the term "electrical component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system which the substrate forms part of.

By the term "film resistor" is meant a resistor of either the thick or thin film type capable of being formed on the upper surface of a suitable supporting substrate, including one of the above dielectric materials. If thick film resistors, these may be formed by screen-printing resistive (sometimes referred to herein as resistor) material onto the substrate and then firing the material, whereas if thin film resistors, these may be formed by sputtering or vacuum-depositing a resistive material on an insulating substrate. As defined herein, the resistive material may also be bonded to a conductive layer (e.g., copper) and then bonded, resistive material down, onto such a substrate.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB can be referred to as a "motherboard" while various other boards (or cards) may be mounted thereon using suitable electrical connectors.

By the term "screen printing" as used herein is meant to include both screen and stencil printing processes as conventionally used today. These involve the use of a screen or stencil through which a desired material, the resistor material, are deposited, e.g., using a squeegee.

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHs), which typically extend through the entire thickness of a substrate. All of these various openings form electrical paths through the substrate and often include one or more conductive layers, e.g., plated copper, thereon. These openings are formed typically using mechanical drilling or laser ablation.

The present invention involves the formation of a plurality of individual film resistors on the surface of a dielectric layer wherein the resistors will form part of the circuit layer on the dielectric. The dielectric and circuit layer will thus form a circuitized substrate according to the broadest definition of such a substrate above; however, the formed substrate is further adapted for being aligned with and bonded to other similar dielectric-conductor sub-composites (often referred to as "cores") as well as individual dielectric and conductor layers, to thereby form a thicker, multilayered circuitized substrate. Such resulting substrates may function successfully as printed circuit boards (PCBs), chip carriers, or the like. The method defined herein utilizes conductor-resistive material "sub-composites" of the type mentioned above which are subjected to conventional photolithographic processing to in turn define a series of individual film resistors on the dielectric. The resistance value variability in the resulting individual resistors is defined by the resistor length and width etch tolerances (the photolithographic processing involving etching), and the resistive material resistivity and thickness tolerances. The resistive material resistivity and thickness tolerances can be collectively referred to as the sheet resistance tolerance. Such sheet resistance has a tendency to vary in a linear manner across the resulting film resistor, meaning that localized variations in such resistance are uncommon.

The present invention utilizes the above-defined linear variation in resistance values by forming a plurality (at least one according to the broader aspects of this invention) of representative film resistors with precise width and length dimensions at predetermined locations on the substrate. The resistance of the representative (sample) resistors at these locations is then measured such that the "sheet resistance" within a predetermined distance from the sample resistor may then be calculated using a formula (provided below). The resistance at these locations within this distance may then be calculated using a statistical analysis method. Using the above formula once again, the required length and width dimension for each of the resistors within these locations is then calculated. The resulting information is then supplied a laser which will in turn perform precise cuts within the resistors and thereby define the desired resistance for each such resistor.

Figure 1:
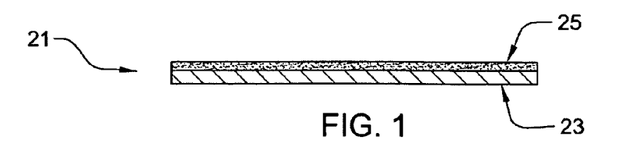
FIG. 1 is a side elevational view, in section, of a conductive layer and layer of resistor material sub-composite structure according to one embodiment of the invention.

In FIG. 1, there is shown a conductive layer and layer of resistor material sub-composite structure 21 according to one embodiment of the invention. Structure 21 includes at least one conductive layer 23, preferably a copper layer having a thickness of from about 0.1 mils (a mil being one thousandth of an inch) to about two mils. Positioned on layer 23 is a layer 25 of resistor material, such as from one of the materials identified above. In one embodiment of this invention, the resistor material is sold under the product name Ohmega-Ply by Ohmega Technologies, Inc., having a business location at 4031 Elenda Street, Culver City, Calif., USA. The invention is not limited to this particular material, as others are possible. For example, it is possible to use the resistor material defined in Ser. No. 11/806,685, cited above, which comprises a polymer resin (e.g., a cycloaliphatic epoxy resin) and a quantity of metal powder material which may be comprised of one or more metals, each having particles of nano-particle and/or micro-particle size therein. In one particular example, the particles may be silver particles while in another example, copper powder may be used. Further, various combinations of copper, graphite and silver may be included in the resin. Layer 25, in this embodiment, has a thickness of only 0.1 microns. In this example, the structure 21 is preferably of rectangular configuration having length and width dimensions of about twenty mils and ten mils, respectively. Understandably, these dimensions typically will depend on the corresponding dimensions of the substrate which the invention will form part of, so these dimensions are not restrictive of the invention. It is further understood that the purpose of providing a larger sheet for structure 21 is to enable the formation of several individual film resistors there-from. This is explained in greater detail below. Layer 25 may be deposited on layer 23 preferably using vacuum deposition or plating methods. Alternatively, layer 25 may be applied to layer 23 using screen printing or stencil printing.

Figure 2:
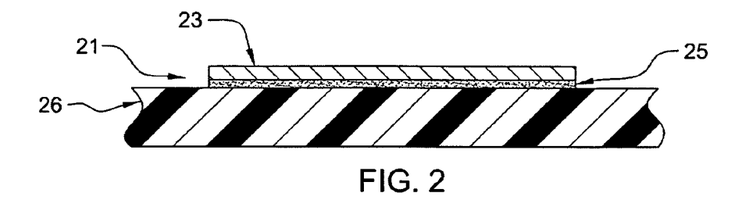
FIG. 2 is a side elevational view, also in section, of the conductive layer and layer of resistor material sub-composite structure of FIG. 1, positioned on a dielectric layer.

In FIG. 2, structure 21 is shown positioned on a dielectric layer 26 which is of a dielectric material suitable for use in a circuitized substrate. Examples are discussed above, and, in this embodiment, the material is the aforementioned "FR-4" dielectric material known in the substrate art. In one example, layer 26 may have a thickness of about five mils. Structure 21 is bonded to dielectric layer 26 using a lamination process similar to those used in PCB manufacturing. In this case, a laminating pressure of about 300 pounds per square inch (PSI) to about 700 PSI may be used, at a temperature of about 180 degrees Celsius (C) to about 220 degrees C. As a result of this lamination, the thickness of the laminated structure 21 is now about one mil, of which the layer of resistor material is 0.1 microns (dimension h in FIG. 4). This thickness is important when determining the final resistance values for the individual resistors to be used in this invention. It is to be understood that layer 26 may represent the upper dielectric layer of a multi-layered substrate (e.g., PCB) including as part thereof several individual dielectric and conductive layers positioned in an alternating manner as is known in the PCB art. In one example, such a PCB may have anywhere from about thirty such dielectric layers and thirty-one conductive layers. Structure 21 may be bonded to the upper surface of such a multi-layered structure, or as an individual bi-layered structure aligned with the respective other layers during the lamination process. If the resulting resistor pattern as defined below is to be positioned internally of the substrate, then the structure of FIG. 2 may be aligned with other dielectric and conductive layers oriented above this structure and lamination of these upper layers may commence. The invention is thus adaptable to various combinations of structures in the circuitized substrate art.

Figure 3:
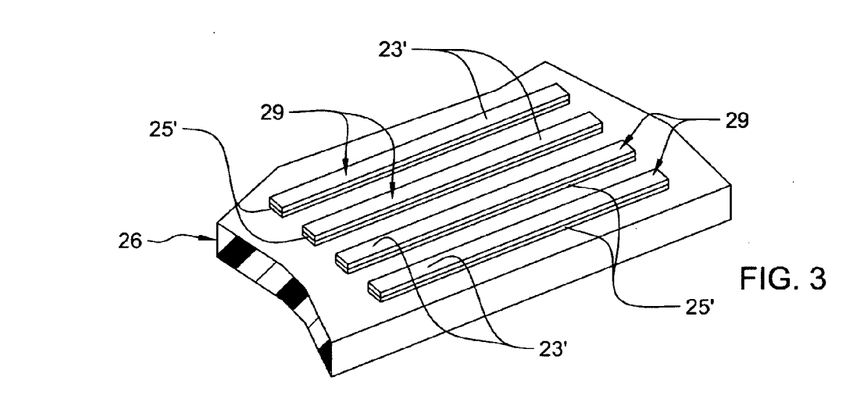
FIG. 3 is a perspective view of an example of the number of individual members which are formed from the structure in FIG. 2.
Figure 6:
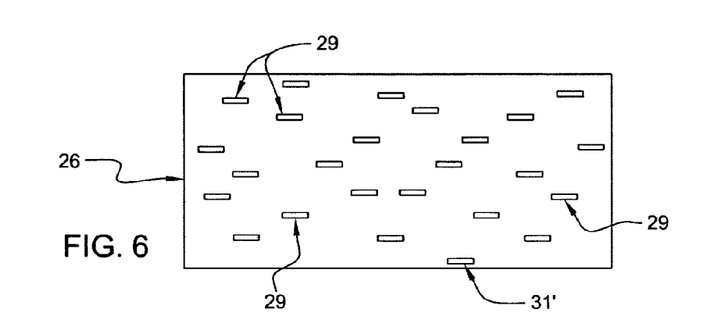
FIG. 6 is a plan view, on a much reduced scale over the views of FIGS. 1-5, showing one example of a substrate having several individual resistors spacedly positioned thereon, said resistors possibly similar to those in FIG. 4.

In FIG. 3, there are shown four individual members 29 on the upper surface of layer 26. Each member 29 is of a specific length and width, and thus of a substantially rectangular configuration, albeit other configurations are possible. Each member includes a partial layer 23' of the originally larger conductive layer 23 thereon, with the corresponding partial layer 25' of the resistor material 25 there-under. To form the desired shapes and locations for the individual members 29 on layer 26, photolithographic processing is used, such processing similar to that used in forming conventional circuit patterns in PCB manufacturing. In such a process, a photoresist material is applied, patterned and developed (removed in selected locations). An etchant (e.g., cupric chloride) is then applied to the exposed surfaces and the material therein is etched away. In another approach, laser ablation may be utilized, using, for example, a Nd:YAG laser. Although four members 29 are shown, ideally several more such members may be formed to meet circuit requirements often demanded in today's substrate art. In FIG. 6, for example, wherein the upper surface of a rectangular (the usual PCB shape) shaped dielectric layer 26 is shown, twenty-five are shown in a spaced relationship to represent that several are possible. In a more specific example, a pattern of a much larger number, e.g., as many as 2,000, of individual members 29 may be formed. The orientations may be in a variety of directions, also, and not in a singular direction as shown in FIG. 6. The precise orientations depend of course on the final circuit pattern which will utilize these members as film resistor members, including other discrete elements (e.g., capacitors) which may form part thereof. These are not shown herein for reasons of simplicity.

Figure 4:
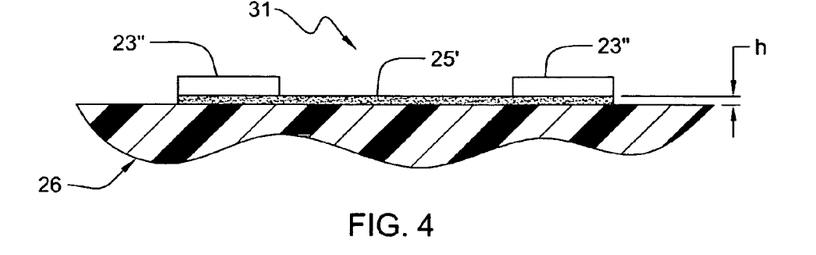
FIG. 4 is a much enlarged view over the views of FIGS. 1-3, showing one of the individual resistor members which may be formed from the FIG. 3 structure.
Figure 5:
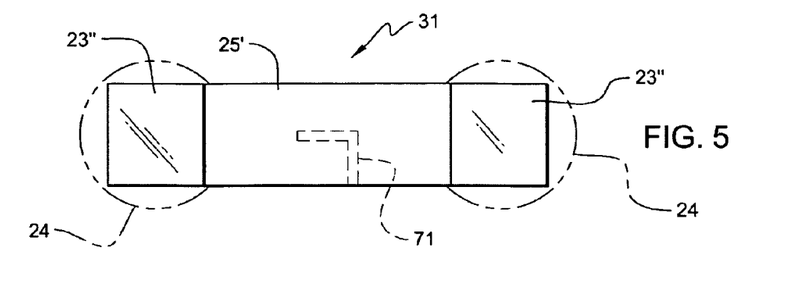
FIG. 5 is an enlarged plan view on a scale approximately the same as in FIG. 4, illustrating one example of a known scribe or similar line formed in the resistor material.

In FIGS. 4 and 5, each of the members 29 (only one shown for illustration purposes) is now subjected to a photolithographic process in which a central part of the upper conductive layer 23' is removed, thereby defining end spaced apart conductors 23". In one example, conductors may be of rectangular shape as shown in FIG. 5 or may have a partial round configuration as represented by the phantom lines in FIG. 5. As a result of this conductive material removal, a pattern of individual film resistors 31 is formed, at the spaced pattern depicted in FIG. 6. The defined amount of conductive material being removed may be removed using the aforementioned photolithographic process with an alkaline ammoniacal etchant to selectively remove conductor material.

In order to provide each of selected ones of the individual film resistors 31 with a precise resistance value, it is now necessary to define the individual resistance of selected "sample" or representative resistors at pre-defined locations on layer 26. In one example, one or more such representative resistors may be chosen which are to be sacrificed in the final peripheral shape of the resulting substrate. That is, one or more samples along the outer periphery in FIG. 6 may be selected with a part of this outer peripheral portion then removed when defining the final outer rectangular shape for the final substrate. As mentioned above, the resistance of these representative resistors is measured such that the "sheet resistance" within a predetermined distance from each representative resistor may then be calculated using a formula below. The resistance at these locations within this distance may then be calculated using a statistical analysis method, also provided below. Using this formula once again, the required length and width dimension for each of the resistors within these locations from the representative resistor is then calculated. The resulting information is then supplied a laser which will in turn perform precise cuts within the resistors and thereby define the desired resistance for each such resistor.

For ease of explanation, one representative sample resistor 31' in FIG. 6 (the end conductors are not shown for this sample and the other spaced film resistors for ease of illustration purposes, it being understood of course that each film resistor will possess two such conductors as in the example of FIGS. 4 and 5) will be selected with the knowledge that all other film resistors on layer 26 are at a close enough distance such that measurements from film resistor 31' will be sufficient that individual resistance values may be finalized for each of these other film resistors. It is also understood that two or more representative resistors may be selected at spaced locations such that a more compact pattern results. Considering only film resistor 31', however, in this simpler example, it is now necessary to precisely define the resistance value of this sample, utilizing the width and length dimensions thereof. As indicated above, the overall thickness (height, h) of the layer of resistor material 25' is not known. Measurements are now taken to determine the width (l) and length (w) of the sample. Measuring the resistor material resistance (R) across a selected resistor, and knowing the length (l) and width (w) dimensions of the sample, the following formula is applied:

$R=rl/A,$ $R=rl/wh,$ $r=Rwh/l,$ $S=Rw/l,$ and $S=r/h$ where
R=representative film resistor's resistance value (ohms),
r=representative film resistor's resistor material resistivity (ohm-cm)
l=representative film resistor's resistor material length (centimeters),
A=area of cross-sectional section through representative film resistor's resistor material (square centimeters),
w=width of representative film resistor's resistor material (centimeters),
h=thickness of representative film resistor's resistor material (centimeters), and
S=assigned value representing the ratio of resistivity (r) to the thickness (h) of the resistor material of the representative film resistor (S is nearly constant for all resistors within a predetermined short distance from the representative film resistor, with r and h not initially being known.)

Hence, it is possible to calculate the precise width necessary for selected ones of the other film resistors using an assigned constant value S from the measured value R and known dimensions for the width and length of the sample, and knowing that the material resistivity (r) does not vary significantly over a given distance from the representative sample film resistor 31'. That is, it is possible to determine the precise width of the other resistor materials for these selected other film resistors without having to determine the material resistivity (r) or the material thickness (h). Utilizing this determined representative resistance value of representative film resistor 31', for a given length (l') of other film resistor materials between pairs of conductors, the precise width (w') of the resistor material of the selected ones of remaining individual film resistors of the plurality of individual film resistors may now be accomplished using the formulas:

$S=R'w'/l',$ $w'=Sl'/R'$ and $w'=Rwl'/R'l,$ where
w'=precise width of the resistor material of selected ones of remaining individual film resistors,
l'=length of resistor material of these selected ones of remaining individual film resistors, and
R'=desired resistance of these selected ones of remaining individual film resistors.

With this determination, selected ones of the remaining film resistors may now be precisely etched (preferably using a laser) to accurately define the resistor material width, and thus the precise resistance value for these selected resistors. Similarly, using the same formula, selected ones of the remaining resistors may be etched to different widths, thus providing different resistance values. The methodology as taught herein is thus able to provide differing resistance values for several resistors in a closely packed (high density) pattern which will in turn form part of a circuit pattern for a substrate as defined herein.

Figure 7:
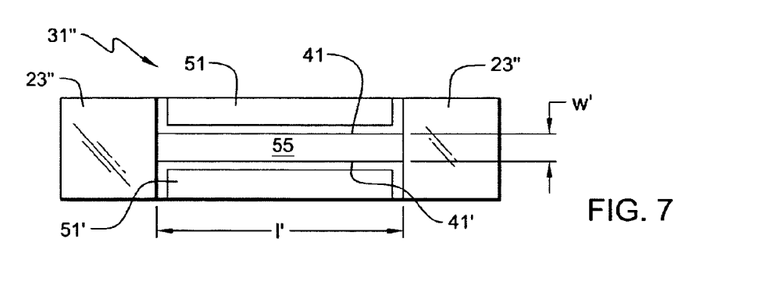
FIGS. 7 and 8 are enlarged plan views, similar in scale to the views in FIGS. 4 and 5, illustrating two examples of etch patterns which may be formed in the resistor material of the formed individual resistors in accordance with the teachings herein.
Figure 8:
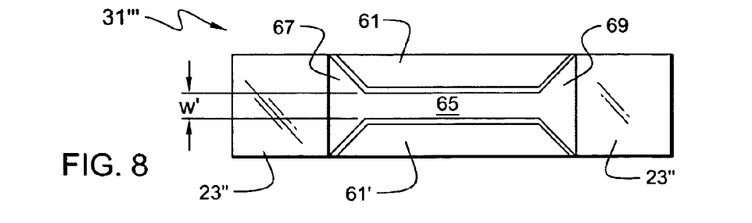

In FIGS. 7 and 8, there are shown two representative patterns which may be etched within the resistor material to form the precise widths (w') for the respective film resistors, 31" in FIGS. 7 and 31''' in FIG. 8. The lengths l' (only one shown, this in FIG. 7) are, as explained above, are accurately known as a result of the highly precise photolithographic processing utilized to remove conductive material 23'. The pattern of remaining resistive material in FIG. 7 is substantially rectangular with parallel sides 41 and 41', meaning that the separated and now isolated side parts (or portions) 51 and 51' are no longer part of the eventual current path through the resistor. That is, only the portion (55) of resistive material between the parallel lines 41 and 41' remains to function as part of the respective film resistor. As stated, this enables the circuit designer to alter the resulting resistance by selectively removing (by etching) resistive material and leaving a desired, precise width thereof remaining as the current path. In FIG. 7, the isolated parts 51 and 51' are also both rectangular. In comparison, the isolated parts 61 and 61' of the film resistor 31''' are substantially trapezoidal, meaning that the center, remaining portion of resistor material (65) has a rectangular shape with substantially triangular ends 67 and 69. This illustrates the ability of the method herein to precisely etch resistor materials of different and more complex shapes than that shown in FIG. 7 while still assuring a desired resistance for the processed film resistor. It is further understood that these precise values are attainable using conductors of different shapes, such as the round ones represented by the phantom lines 24 in FIG. 5. (FIG. 5 also illustrates a known etch pattern 71 (L-shaped, shown by hidden lines) used in one or more of the aforementioned known trimmable resistor approaches. Understandably, such an etch pattern is designed to extend a desired distance across the resistive material and thus prevent current from passing there-over. Such a pattern is inherently unable to provide the precise results taught by the present invention, e.g., due to the presence of a significant amount of resistor material which must affect the ultimate resistance.)

Etching of patterns of resistor material such as shown in FIGS. 7 and 8 is preferably accomplished using a laser, and particularly an Nd:YAG laser. One such laser is available from Electro Scientific Industries, Inc., having a business location at Portland, Oreg., and is sold under the product designation Model 4990.

The resistance values capable of being provided by the method taught herein are carefully selected to draw very little energy from the signal current passing through the circuit which utilizes one or more of the film resistors produced herein. Accordingly, data is transferred faster in a circuitized substrate using this invention in comparison to similar structures sans a resistor. The careful, precise selection of resistance values for these circuits may be further enhanced by the use of resistor materials such as taught in Ser. No. 11/806,685, which include nano-particles and/or micro-particles as part thereof, in addition to using the defined screen printing operation to accomplish precise deposition thereof. Of further significance, these advantages are made possible without significant additional cost to the process of making the invention. As further understood from the teachings herein, the internal (or embedded) film resistors formed within the substrate are uniquely able to provide a multitude of different resistance values in a variety of circuit combinations, or, simply, within only one circuit. It is further understood that the examples described and shown herein are not meant to limit the invention, as many additional possibilities exist and are well within the scope of one skilled in the art. Again, this invention thereby represents a significant advancement in the art.

Figure 9:
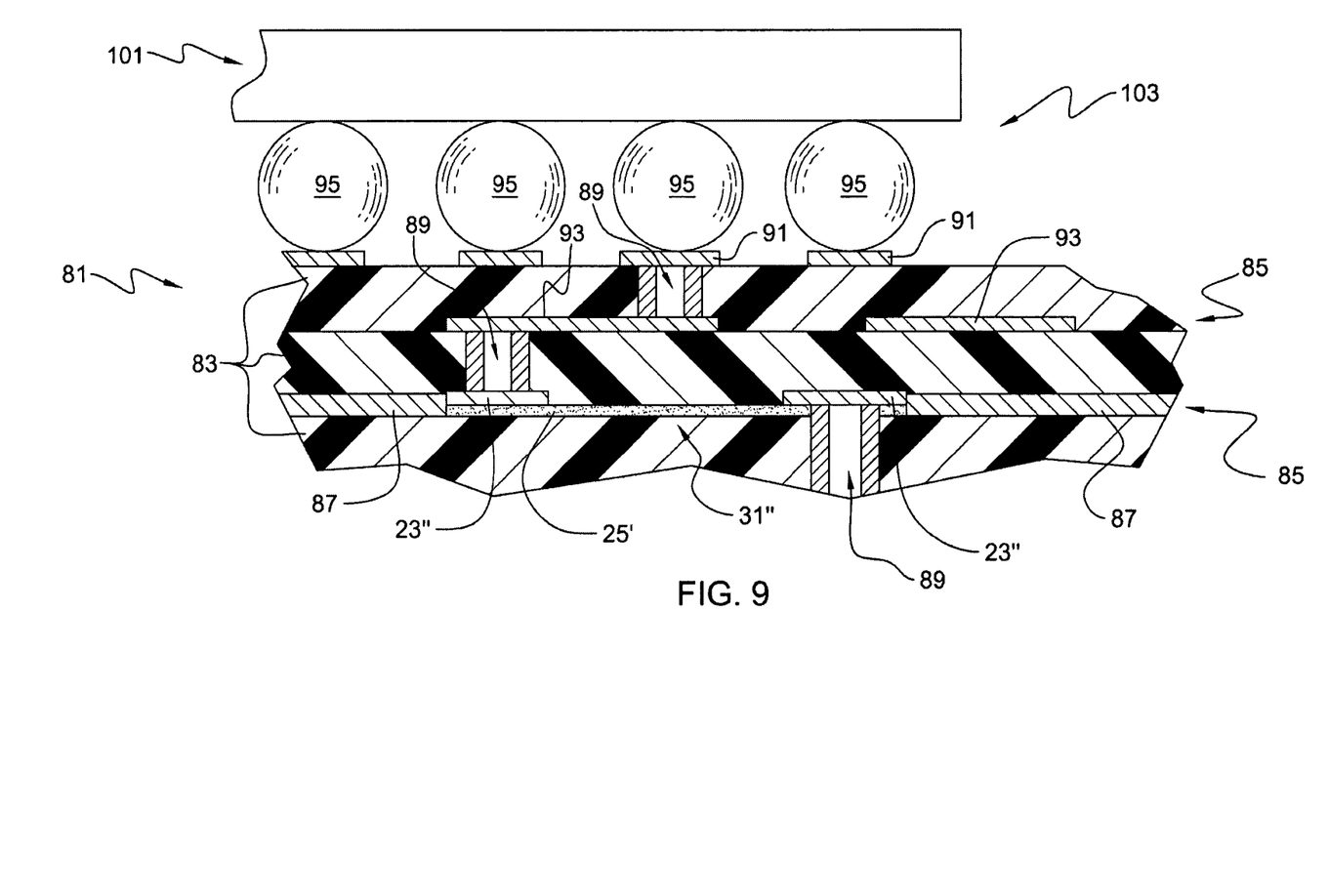
FIG. 9 is a side elevational view of an electrical assembly according to one embodiment of the invention, said assembly including one of the individual resistors of the invention as part thereof.

FIG. 9 represents an example of a circuitized substrate 81 having at least one (and possibly many more if desired) film resistor 31" therein. Resistor 31" is preferably of similar configuration to the film resistor in FIG. 7, but of course may assume any other of the possible shapes for the film resistors processed herein. Substrate 81 includes a plurality of dielectric layers 83, preferably of one of the above dielectric materials (e.g., "FR4") with a corresponding plurality of alternatively oriented conductive layers 85. As seen, film resistor 31" forms part of the circuitry of the lower conductive layer 85, the spaced conductors 23" and resistive material 25' clearly illustrated. This lower layer also includes at least two circuit lines or pads 87 which are electrically coupled to the respective conductors and thereby form a circuit path across the planar lower layer 85. Substrate 81 may further include thru-holes 89 therein, which are often required to meet the increased operational demands in today's circuit patterns. Thru-holes 89 (three shown) may extend from a solder ball or similar conductor pad 91 on the substrate's upper surface down to a circuit line or pad 93 which may form part of another circuit pattern on the first (upper) internal conductive layer 85, which in turn may be coupled to another thru-hole 89 which extends down to the left conductor 23". Finally, yet another thru-hole 89 may extend up through the third internal dielectric layer 83 to engage the right side conductor 23". These orientations of thru-holes and circuit lines or pads are not meant to limit the invention as it is readily possible to use several alternative combinations of circuit patterns which may include one or perhaps several of the film resistors herein. In the FIG. 9 example, a circuit pattern is formed from the second from the right solder ball 95 through its pad 91, the thru-hole 89 there-under, the circuit line or pad 93 to the thru-hole 89 which extends to the left side conductor 23", then through the resistive material 25' to the third thru-hole 89 and down into the substrate to a predefined location. Current may further pass through the circuit lines or pads 87 if these also form part of this circuit. A circuit designer is thus able to precisely define the resistance for the film resistor 31" in FIG. 9, to meet the operational requirements for this circuit path.

Circuitized substrate 81 may be a PCB or chip carrier, both products produced and sold by the Assignee of the invention. In the embodiment (assembly) of FIG. 9, the substrate includes an electrical component 101 mounted thereon, this component possibly being a semiconductor chip electrically coupled to the substrate at several locations using the plurality of solder balls 95, each preferably of conventional tin-lead composition. Therefore, FIG. 9 illustrates what is known as an electrical assembly 103 including at least one circuitized substrate 81 (e.g., PCB or chip carrier) having thereon at least one electrical component 101 (e.g., semiconductor chip). Such an assembly 103 may include a chip carrier as the component, which may also be coupled to the substrate, e.g., a PCB, using solder balls. Other possibilities are well within the understanding of one of ordinary skill in the art. For example, the structure in FIG. 9 may also include a heat sink (not shown) thermally coupled to component 101, e.g., using a conductive paste, and positioned on the upper surface of substrate 81 utilizing appropriate standoffs, as is known in the art. It is also within the scope of those skilled in the art to utilize an encapsulant material (not shown) to substantially encase the chip and also to possibly eliminate the need for the heat sink. It is even further within the scope of the invention to couple component 101, if a chip 49, using conventional wire-bonding in which a plurality of fine wires (not shown) are bonded between chip conductor sites and corresponding conductor pads on the underlying substrate. If solder balls 95 and a semiconductor chip are used, these interconnect contact sites (not shown) on the chip's underside to the defined corresponding pads 91.

Electrical assemblies including circuitized substrates of the type formed herein may be utilized in what are referred to in the art as "information handling systems" (defined above). Well known examples of such "systems" include personal computers, mainframe computers and computer servers. Other types of information handling systems known in the art of this type may also utilize the teachings of this invention. The circuitized substrate or substrates as formed in accordance with the teachings herein, each including one or more internal resistors as taught above, may be utilized in the system, e.g., as a "mother board" or as one or more individual PCBs. Such boards and other PCBs are typically positioned with a suitable housing and in turn coupled to other internal components of the final system.

Thus there has been shown and described a circuitized substrate having one or more internal resistors as part thereof, which substrate can be formed using many conventional PCB processes to thereby reduce costs associated with production thereof. The substrates produced herein are readily adaptable for use in electrical assemblies in which one or more electrical components such as semiconductor chips may be positioned thereon and coupled thereto. There have also been defined several examples of resistor materials which can be positioned between two adjacent conductors as part of such a circuit line to form circuitry for these substrates. Most significantly, the invention affords the opportunity to vary the resistances between conductors by varying the resistor material composition, as represented by the foregoing Examples. Such latitude greatly assists the circuit designer in meeting varying operational requirements.

While there have been shown and described what at present are considered the preferred embodiments of the invention, it will be obvious to those skilled in the art that various changes and modifications may be made therein without departing from the scope of the invention as defined by the appended claims. As defined above, the method taught herein utilizes initial resistor dimensions which are large enough so that these may be "trimmed" to the precise values needed, given the anticipated sheet resistances (and the etch tolerances because etching is used). It is believed that using the methodology taught herein that effective resistor material trimming may be accomplished with a tolerance of approximately two percent of even better. Further, because the materials used are relatively very thin, laser patterning is very quickly accomplished. Significantly, the heretofore combined probe and trim procedure in which the resistor material is heated, resulting possibly in incorrect resistance measurements, is eliminated. Of added significance, the invention is able to assure circuit pattern miniaturization as is deemed extremely important with regards to many of today's design requirements.

What is claimed is:

1. A method of making a circuitized substrate having circuitry including a plurality of film resistors as part thereof, said method comprising:

providing a conductive layer having a layer of resistor material thereon;

providing a dielectric layer;

bonding said conductive layer having said layer of resistor material thereon to said dielectric layer such that said layer of resistor material directly contacts said dielectric layer;

removing selected portions of said conductive layer and said resistor material to form a plurality of individual members each including a length and width of said resistor material and a portion of said conductive layer thereon;

removing selected portions of said portion of said conductive layer on each of said individual members to define first and second spaced apart conductors on said length and width of said resistor material of each of said individual members and thereby define a plurality of individual film resistors;

measuring resistance values across said resistor material at predefined locations thereof;

determining a representative resistance value of a representative film resistor of said plurality of individual film resistors in a predetermined region as a sample of sheet resistance according to said length and width dimensions of said resistor material of said representative film resistor;

utilizing said representative resistance value of said representative film resistor to determine the precise width of said resistor material of selected ones of the remaining individual film resistors of said plurality of individual resistors within a predetermined distance of said representative film resistor so as to provide a desired resistance value for each of said selected ones of said remaining individual film resistors in said region;

etching a pattern of lines within said resistor material of each of said selected ones of said remaining individual film resistors to define a precise width of said resistor material for each of said selected ones of said remaining individual film resistors in order that said selected ones of said remaining individual film resistors will each possess said desired resistance; and trimming said individual film resistors exclusive of subsequent resistance measuring.

2. The method of claim 1 wherein said bonding of said conductive layer having said layer of resistor material thereon to said dielectric layer such that said layer of resistor material directly contacts said dielectric layer is accomplished using lamination.

3. The method of claim 1 wherein said removing of said selected portions of said conductive layer and said resistor material to form a plurality of individual members each including a length and width of said resistor material and a portion of said conductive layer thereon is accomplished using at least one of the group:

laser ablation and photolithographic processing.

4. The method of claim 3 wherein said removing of said selected portions of said portion of said conductive layer on each of said individual members to define first and second spaced apart conductors on said length and width of said resistor material of each of said individual members and thereby define a plurality of individual film resistors is accomplished using at least one of the group: laser ablation and photolithographic processing.

5. The method of claim 3 wherein said etching of said pattern of lines within said resistor material of each of said selected ones of said remaining individual film resistors to define said precise width of said resistor material for each of said selected ones of said remaining individual film resistors using said laser ablation includes isolating at least one part of said resistor material of said selected ones of said remaining individual film resistors from the remainder of said resistor material.

6. The method of claim 5 wherein said etching of said pattern of lines within said resistor material and isolating at least one part of said resistor material of said selected ones of said remaining individual film resistors from the remainder of said resistor material involves forming said at least one part of said resistor material with a substantially rectangular pattern.

7. The method of claim 5 wherein said etching of said pattern of lines within said resistor material and isolating at least one part of said resistor material of said selected ones of said remaining individual film resistors from the remainder of said resistor material involves forming said at least one part of said resistor material with a substantially trapezoidal pattern.

8. The method of claim 5 wherein said etching of said pattern of lines within said resistor material of each of said selected ones of said remaining individual film resistors to define said precise width of said resistor material for each of said selected ones of said remaining individual film resistors using said laser ablation includes isolating two opposed parts of said resistor material.

9. The method of claim 8 wherein each of said two opposed parts of said resistor material of each of said selected ones of said remaining individual film resistors includes a substantially rectangular pattern.

10. The method of claim 8 wherein each of said two opposed parts of said resistor material of each of said selected ones of said remaining individual film resistors includes a substantially trapezoidal pattern.

11. The method of claim 1 wherein said determining of said representative resistance value of said representative film resistor is accomplished using the formulas:

$$R = rl/A,$$

$$R = rl/wh,$$

$$r = R\,w\,h/l,$$

$$S = R\,w/l, \text{ and}$$

$$S = r/h$$

where: R=representative film resistor's resistance value,
r=representative film resistor's resistor material resistivity
l=representative film resistor's resistor material length,
A=area of cross-sectional section through representative film resistor's resistor material,
w=width of representative film resistor's resistor material,
h=thickness of representative film resistor's resistor material, and
S=assigned value representing the ratio of resistivity (r) to the thickness (h) of the resistor material of the representative film resistor.

12. The method of claim 11 wherein said utilizing of said representative resistance value of said representative film resistor to determine the precise width of said resistor material of said selected ones of said remaining individual film resistors of said plurality of individual film resistors is accomplished using the formulas:

$$S = R'w'/l',$$

$$w' = Sl'/R' \text{ and}$$

$$w' = R\,w\,l'/R'l,$$

where: w'=precise width of said resistor material of selected ones of remaining individual film resistors,
l'=length of resistor material of said selected ones of remaining individual film resistors, and
R'=desired resistance of said selected ones of remaining individual film resistors.

13. The method of claim 1 further including forming a pattern of conductive material on said dielectric layer and electrically coupling said pattern of conductive material to said selected ones of said remaining individual film resistors to form at least one electrical circuit on said dielectric layer.

14. The method of claim 13 further including bonding at least one dielectric layer to said dielectric layer having said electrical circuit thereon to form a multi-layered circuitized substrate such that said selected ones of said remaining individual film resistors will be covered with said at least one dielectric layer and thus be positioned internally of said multi-layered circuitized substrate.

15. The method of claim 14 further including forming a circuit pattern on said multi-layered circuitized substrate and electrically coupling at least one electrical component thereto so as to form an electrical assembly.

16. The method of claim 15 further including providing a housing and positioning said electrical assembly therein to form an information handling system.

* * * * *